(12) United States Patent
Chuah et al.

(10) Patent No.: US 11,758,662 B2
(45) Date of Patent: Sep. 12, 2023

(54) THREE DIMENSIONAL FOLDABLE SUBSTRATE WITH VERTICAL SIDE INTERFACE

(71) Applicant: Intel Corporation, Santa Clara, CA (US)

(72) Inventors: Tin Poay Chuah, Bayan Lepas (MY); Bok Eng Cheah, Bukit Gambir (MY); Jackson Chung Peng Kong, Tanjung Tokong (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/828,142

(22) Filed: May 31, 2022

(65) Prior Publication Data

US 2022/0369460 A1 Nov. 17, 2022

Related U.S. Application Data

(63) Continuation of application No. 16/887,902, filed on May 29, 2020, now Pat. No. 11,375,617.

(30) Foreign Application Priority Data

Aug. 15, 2019 (MY) .............................. PI2019004700

(51) Int. Cl.
*H05K 1/14* (2006.01)
*H01R 12/77* (2011.01)
(Continued)

(52) U.S. Cl.
CPC ............. *H05K 1/147* (2013.01); *H01R 12/77* (2013.01); *H05K 1/028* (2013.01); *H05K 1/181* (2013.01);
(Continued)

(58) Field of Classification Search
CPC ........ H05K 1/147; H05K 1/028; H05K 1/181; H05K 3/303; H05K 3/361; H01R 12/77
(Continued)

(56) References Cited

U.S. PATENT DOCUMENTS 6,021,048 A 2/2000 Smith
6,300,679 B1 10/2001 Mukerji et al.
(Continued)

OTHER PUBLICATIONS

"U.S. Appl. No. 16/887,902, Non Final Office Action dated Jul. 7, 2021", 16 pgs.
(Continued)

*Primary Examiner* — Andargie M Aychillhum
(74) *Attorney, Agent, or Firm* — Schwegman Lundberg & Woessner, P.A.

(57) ABSTRACT

An electronic device and associated methods are disclosed. In one example, the electronic device includes a first rigid substrate, a second rigid substrate, a flexible substrate comprising a first portion attached to the first rigid substrate, a second portion attached to the second rigid substrate, a middle portion connecting the first portion to the second portion, wherein the middle portion is bent, and metallic traces therethrough, and a component forming a direct interface with the middle portion of the flexible substrate, the component electrically coupled to the metallic traces. In selected examples, the device further includes a casing.

17 Claims, 8 Drawing Sheets

(51) Int. Cl.
    *H05K 1/02*     (2006.01)
    *H05K 1/18*     (2006.01)
    *H05K 3/36*     (2006.01)
    *H05K 3/30*     (2006.01)

(52) U.S. Cl.
    CPC ............ *H05K 3/303* (2013.01); *H05K 3/361* (2013.01); *H05K 2201/055* (2013.01); *H05K 2201/2018* (2013.01); *H05K 2203/166* (2013.01)

(58) Field of Classification Search
    USPC .......................................................... 361/749
    See application file for complete search history.

(56) References Cited

U.S. PATENT DOCUMENTS

| | | | |
|---|---|---|---|
| 7,265,719 | B1 | 9/2007 | Moosbrugger et al. |
| 7,605,679 | B1* | 10/2009 | Doane .................. H01P 1/02 333/34 |
| 8,144,473 | B2 | 3/2012 | Yumoto et al. |
| 11,375,617 | B2 | 6/2022 | Chuah et al. |
| 2002/0149074 | A1* | 10/2002 | Imaeda ............... G02F 1/13452 257/432 |
| 2004/0266249 | A1* | 12/2004 | Dobbs .................. H05K 7/1417 439/376 |
| 2007/0229369 | A1* | 10/2007 | Platz .................... H04R 25/554 343/866 |
| 2011/0255250 | A1 | 10/2011 | Dinh et al. |
| 2015/0351222 | A1 | 12/2015 | Baba et al. |
| 2016/0085269 | A1 | 3/2016 | Yeh et al. |
| 2016/0174378 | A1* | 6/2016 | Johnson .................. H05K 1/148 29/830 |
| 2019/0320096 | A1* | 10/2019 | Chen ........................ G02B 7/04 |
| 2021/0051801 | A1 | 2/2021 | Chuah et al. |

OTHER PUBLICATIONS

"U.S. Appl. No. 16/887,902, Response filed Oct. 7, 2021 to Non Final Office Action dated Jul. 7, 2021", 8 pgs.

"U.S. Appl. No. 16/887,902, Final Office Action dated Dec. 1, 2021", 16 pgs.

"U.S. Appl. No. 16/887,902, Response filed Feb. 1, 2022 to Final Office Action dated Dec. 1, 2021", 8 pgs.

"U.S. Appl. No. 16/887,902, Notice of Allowance dated Feb. 24, 2022", 9 pgs.

U.S. Appl. No. 16/887,902 U.S. Pat. No. 11,375,617, filed May 29, 2020, Three Dimensional Foldable Substrate With Vertical Side Interface.

* cited by examiner

THREE DIMENSIONAL FOLDABLE SUBSTRATE WITH VERTICAL SIDE INTERFACE

This application is a continuation of U.S. patent application Ser. No. 16/887,902, filed on May 29, 2020, now issued as U.S. Pat. No. 11,375,617, which claims the benefit of priority to Malaysian Application Serial No. PI 2019004700, filed Aug. 15, 2019, each of which is incorporated herein by reference in its entirety.

BACKGROUND

Electronic devices can include components mounted on a package or a circuit board. In some devices, corners or bends in packaging do not allow for component mounting. It is desired to have packaging that addresses these concerns, and other technical challenges.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Extensive interconnects having length or widespread transitions can caused signal and power integrity degradation. This can be caused, for example, in printed circuit board (PCB) assemblies, by excessive vertical interconnects, such as plated through holes, ball grid arrays, or other cable and connector components in PCB systems. In particular, where interconnects run through several PCB substrates, bends, or corners, signal and power degradation can occur between components on those substrates.

Previous solutions included dual sided PCB assemblies, which increased system thickness and demanded relocation of components to opposing sides of PCB substrates, or direct board-to-board cable attachments. Both approaches resulted in reduction of system form-factor through height trade-off, or were subject to mechanical and reliability constraints, all of which increased manufacturing costs.

The discussed assembly configurations allow for form-factor miniaturization with increased performance and functionality by mounting components directly on a flexible substrate making the bend or corner between PCB substrates.

These configurations can allow for a footprint reduction through repartition of electronic components using a vertical peripheral interface on the flexible substrate. This can, for example, result in improved electrical performance through shorter or more direct, less congested electrical routing. For example, insertion loss and crosstalk coupling can be improved.

Additionally, channel impedance mismatches (or signal return loss) can be minimized between transmitter and receiver devices or other passive components by avoiding less desirable signal path transitions, such as plated through holes, ball-grid arrays, or internal cable/connector assemblies.

Figure 1A:
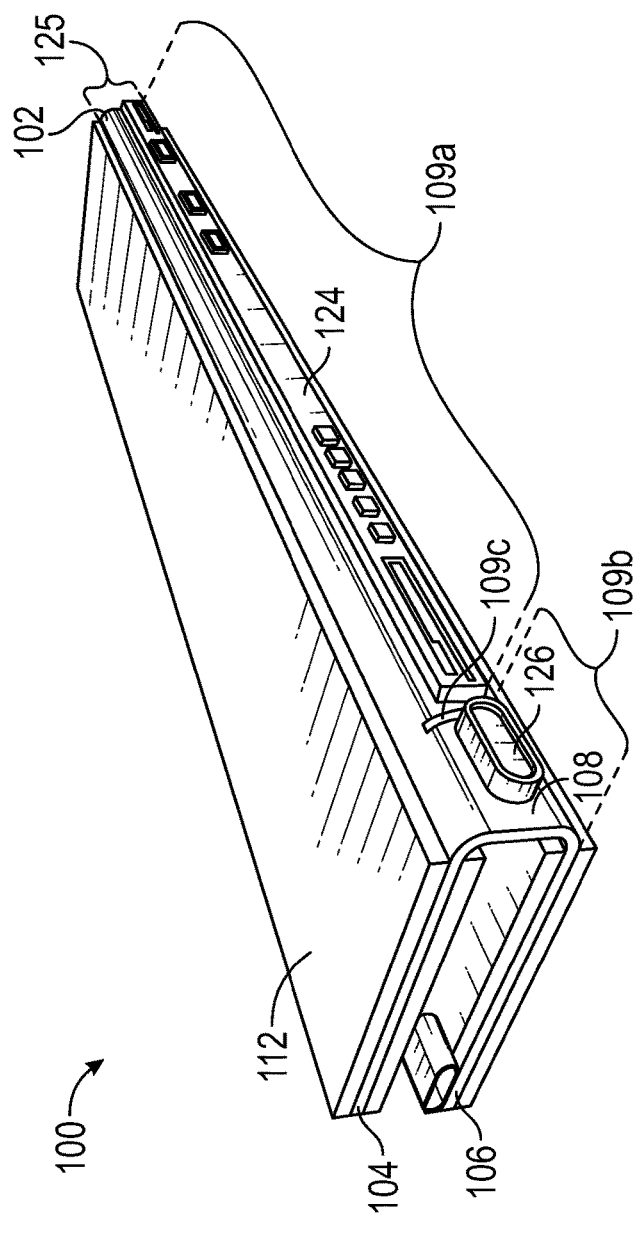
FIGS. 1A-1B show perspective views of an electronic assembly in accordance with some example embodiments.
Figure 1B:
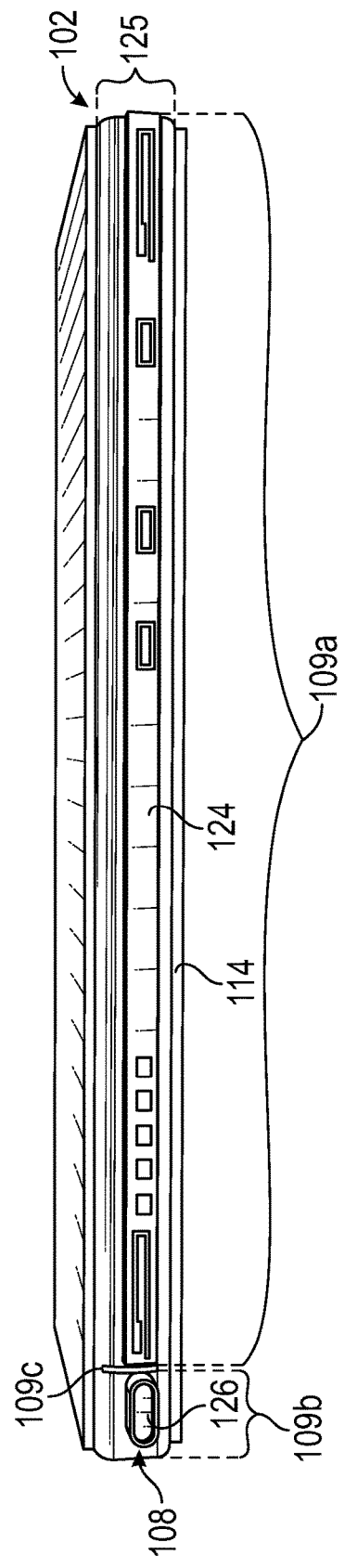
Figure 1C:
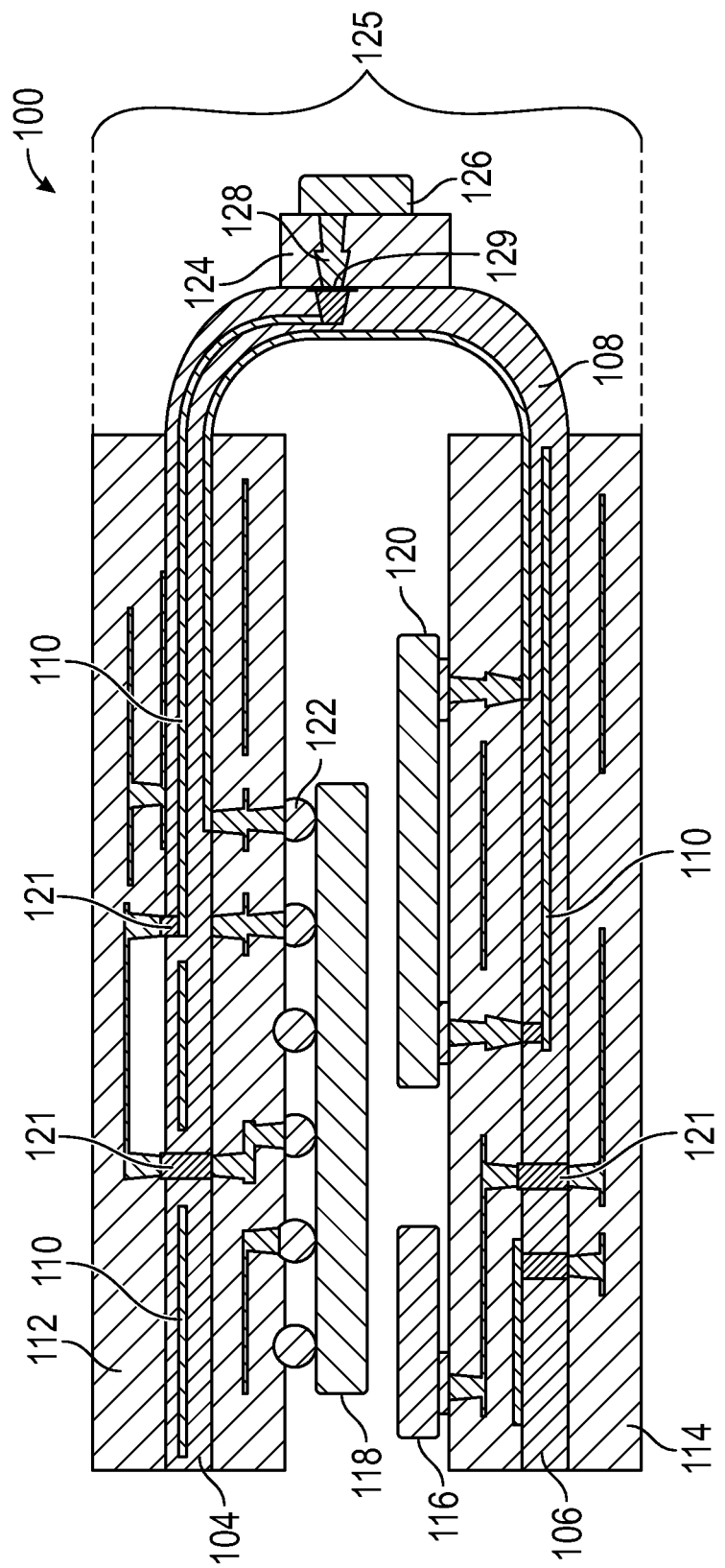
FIG. 1C shows a schematic cross-section view of the electronic assembly of FIGS. 1A-1B in accordance with some example embodiments.

FIGS. 1A-1C show views of electronic assembly 100 in accordance with some example embodiments. FIGS. 1A-1C will be discussed together. Assembly 100 can be, for example, a 3D foldable PCB device with a peripheral vertical interface for form-factor miniaturization. Form-factor of an electronic device is an aspect of hardware design which defines and prescribes the size, shape, and other physical specifications of components. A smaller form-factor represented more efficient use of limited space and greater flexibility in the placement of components.

Assembly 100 includes flexible substrate 102 with portions 104, 106, and 108, segments 109a, 109b, and space 109c, and traces 110, rigid substrates 112, and 114, with components 116, 118, and 120, and interconnects 122, vertical side panel 124, side component 126, and interconnect 128.

In assembly 100, flexible substrate 102 forms a direct interface with rigid substrates 112 and 114. Specifically, in assembly 100, rigid substrate 112 can be, for example, connected to first portion 104 of flexible substrate 102, while rigid substrates 114 can be, for example, connected to second portion 106 of flexible substrate 102. In some aspects, the rigid substrate can sandwich the portion of the flexible substrate.

Components 116, 118, 120 can be, for example, mounted on rigid substrates 112 and 114, electrically coupled to each other or connected to the substrates 112, 144, via interconnects 122.

Middle portion 108 of flexible substrate 102 can connect first portion 104 (with attached rigid substrate 112) to second portion 106 (with attached rigid substrate 114). Middle portion 108 can be bent so that first portion 104 (with attached rigid substrate 112) is parallel to second portion 106 (with attached rigid substrate 114). Side component 126 can be attached to middle portion 108 of flexible substrate 102. Side panel 124 can be, for example, attached to the middle portion 108 of flexible substrate 102. Side panel 124 can be vertical, at a bias to a major surface of the rigid substrates 112, 114, or in a different appropriate configuration.

Flexible substrate 102 can be, for example, a liquid crystal polymer (LCP), a polyimide-based film (PI), or other suitable polymer. Flexible substrate 102 can have a thickness of about 50 μm to about 300 Optionally, flexible substrate 102 can be laminated. Flexible substrate 102 can be, for example, a dielectric material with good mechanical bending. In some aspects, flexible substrate 102 can be formed with rigid substrates 112, 114.

Portions 104 and 106 can be, for example, of comparable size. Portions 104 and 106 of flexible substrate 102 can be connected by middle portion 108. Middle portion 108, residing in the vertical interface area 125, can be bent to align portions 104 and 106 such that portions 104 and 106 are approximately parallel to each other. Portions 104 and 106 can be, for example, larger than portion 108, so that portions 104 and 106 can host a larger plurality of electrical components. In some embodiments, each of portions 104 and 106 can be sandwiched by a rigid substrate, such as 112 or 114. Alternatively, a rigid substrate can reside on only one side of one or both portions 104, 106. In some embodiments, flexible substrate 102 and the rigid substrates are formed together.

In some embodiments, the middle portion 108 includes segments 109a and 109b that are spaced apart, for example by a gap 109c extends through the flexible substrate 102 to facilitate movement of the flexible portion 108 (e.g., in a direction parallel to the rigid substrates 112 and 114).

Traces 110 can be metallic traces that are integrated within or on flexible substrate 102, throughout portions 104, 106, 108. Alternatively, traces 110 can be a different type of conductive material, such as conductive epoxy or a nitride. Trace 110 can allow for electrical connection between components in assembly 100 that are mounted on rigid or flexible substrates. Traces 110 can be, for example, copper traces.

Alternatively, flexible substrate 102 can be a plurality of metal layers (i.e., copper) stacked and separated by LCP or a PI dielectric layers. Where flexible substrate 102 includes a plurality of metal layers, the total flexible substrate 102 has at least a voltage referencing layer associated to a ground ($V_{ss}$) or a power ($V_{cc}$) reference voltage, and at least a signal routing layer.

Rigid substrates 112, 114, can be, for example, standard printed circuit board (PCB). Generally, rigid substrates 112, 114, can be an electrically nonconductive material, such as printed circuit board, organic packaging, silicon-based substrates, or interposers. In some embodiments, the rigid substrates are formed with the flexible substrate 102. Optionally, traces 110 can run through or on rigid substrates 112, 114, to complete circuitry between various components. Alternatively, interconnects 121 can run through rigid substrates 112, 114, serving to connect components to traces 110. In some aspects, rigid substrates 112, 114, can be formed with flexible substrate 102.

Components 116, 118, 120, reside on the rigid substrates 112, 114, and can include active or passive components. Components 116, 118, 120 can be directly connected to rigid substrates 112, 114. Components 116, 118, 120 can include, for example, connectors, switches, displays, transmitters, receivers, or antennae, among others. In some embodiments, the components 116, 118, 120 can include central processing unit (CPU), graphic processor, platform controller hub (PCH) or chipset, memory device, or field programmable gate array (FPGA), among others. The components 116, 118, 120, can reside on either opposing surface of the rigid substrates 112, 114. Optionally, components 116, 118, 120, can each include their own interposer substrate and/or housing such as a circuit board, a package substrate or a silicon interposer, and may have active or passive circuitry incorporated into the component.

Components 116, 118, 120, can be connected to traces 110 through interconnects 122. Interconnects 122 can be, for example, vertical via interconnects, or other solder bumps or traces as appropriate. Interconnects 121 can anchor components 116, 118, 120, to rigid substrates 112, 114, and flexible substrate 102, and can allow electrical networking of components 116, 118, 120, with traces 110. The traces 110 can allow components 116, 118, 120, to electrically couple with each other and other components incorporated with or external to assembly 100.

Side panel 124, residing in the vertical interface area 125, can be, for example, a PCB rigid substrate located on middle portion 108 of flexible substrate 102. Side panel 124 can be separate from rigid substrates 112, 114, to allow flexible substrate 102 to be bent and create the shape of the device into which assembly 100 will be inserted. In assembly 100, side panel 124 does not necessarily cover all of middle portion 108 of flexible substrate 102. This allows components to be mounted both on side panel 124, and directly onto middle portion 108 of flexible substrate 102 without the intermediate side panel 124.

For example, side component 126 can be mounted on middle portion 108 of flexible substrate 102 in vertical interface area 125, near or on side panel 124. Side component 126 can be, for example, a speaker, a radio-frequency integrated circuit, sensor, control switch, LED indicator, connector receptacle, antenna, or other component as described above. Component 126 can be directly interfaced with portion 108 and connected to traces 110 within flexible substrate 102 via interconnect 128 and contact pad 129. Interconnect 128 can be, for example, a via or other solder layer as appropriate. Alternatively, side component 126 can be directly mounted to segment 109b of flexible portion 108 via contact pad 109c without passing through the side panel 124.

In some embodiments of assembly, component 116 can be a CPU or other silicon package device, such as a system-on-chip (SOC). Component 118 can be an active component (i.e., a silicon package device, such as a chipset), and component 120 can be a passive component (i.e., capacitor, resistor, connector, etc.) Side component 126 can be either an active or passive component. In this example configuration, CPU component 116 can be interconnected with the active component 118, the passive component 120, and the side component 126 through interconnects 121 and traces 110.

Figure 1D:
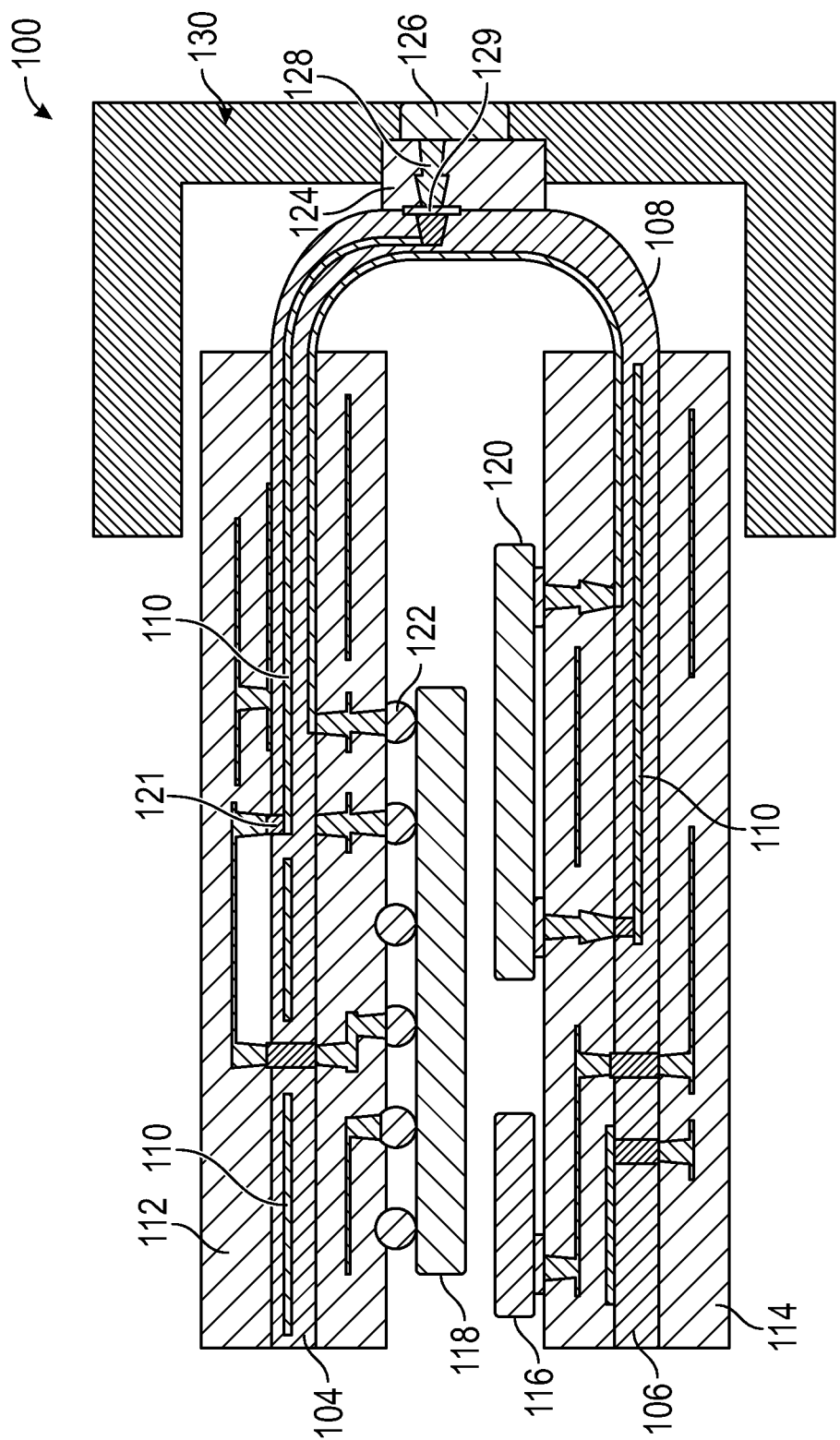
FIG. 1D shows a schematic cross-section view of an electronic assembly with a housing in accordance with some example embodiments.

FIG. 1D shows a schematic cross-section view of the electronic assembly of FIGS. 1A-1B in accordance with some example embodiments. Here, assembly 100 further includes housing 130 attached to side panel 124. Housing 130 can be, for example, a metallic, plastic, or other composite material. Housing 130 serves to protect flexible portion 108, side panel 124, and component 126, from external forces. In some embodiments, side panel 124 or component 126 extends at least partially through housing 130. In some embodiments, at least a portion of side panel 124 or component 126 is accessible from external through housing 130.

Figure 1E:
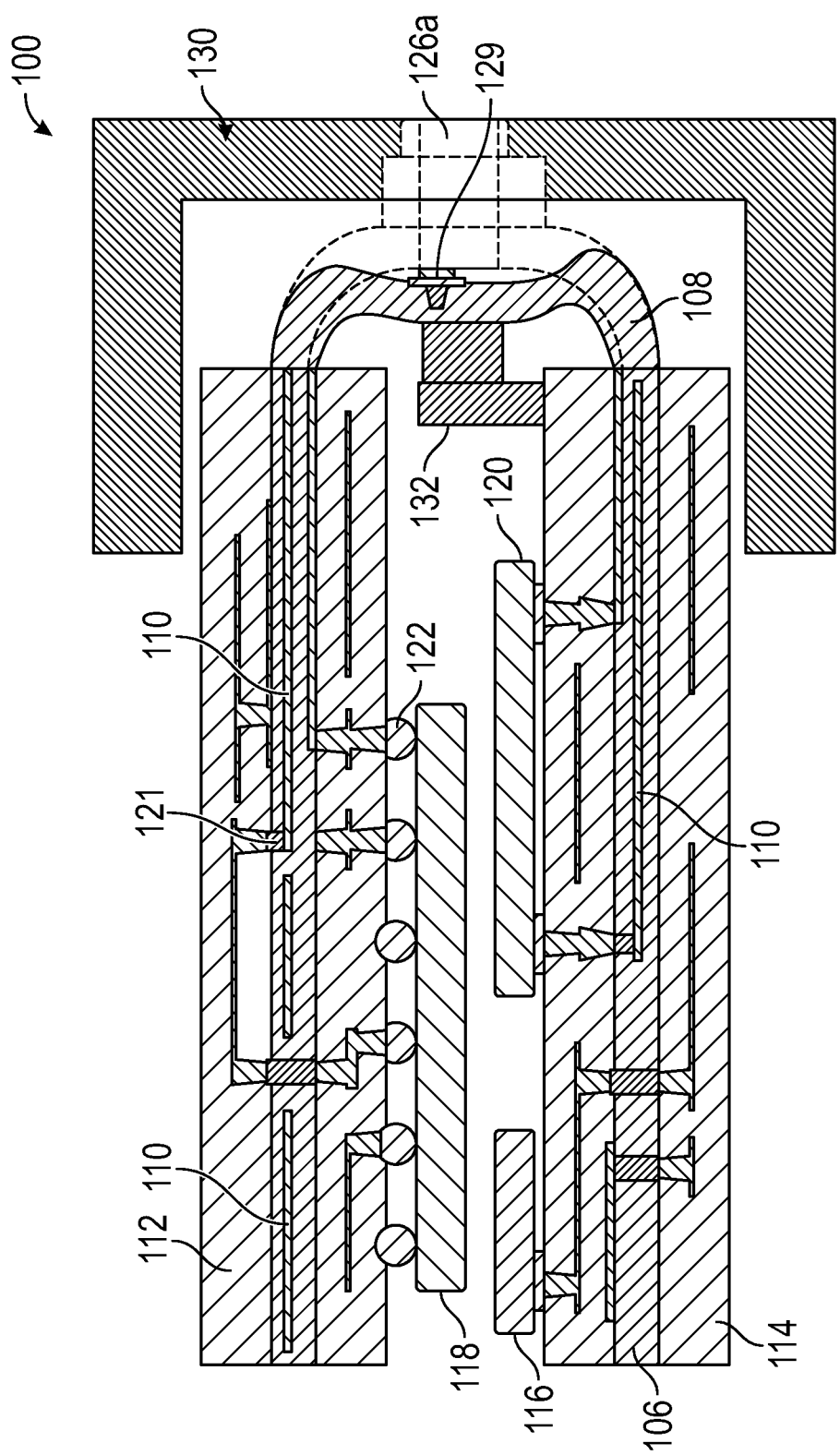
FIG. 1E shows a schematic cross-section view of an electronic assembly with a housing in accordance with some example embodiments.

FIG. 1E shows a schematic cross-section view of an electronic assembly with a housing in accordance with some example embodiments. The assembly 100 in FIG. 1E includes the housing 130 of FIG. 1D but shows a second component 126a that is mounted on flexible portion 108 and nested in housing 130. Component 126a forces flexible portion 108 to bend or to move laterally towards the rigid substrates 112 and 114 when housing 130 is applied to assembly 100. The lateral movement or bend of portion 108 is facilitated by the gap 109c that separates segment 109b from segment 109a (i.e., with side panel 124).

In some embodiments, the side component 126 can be a first side component 126. The first side component 126 having a first thickness is mounted on the side panel 124. A second side component 126a having a second thickness is directly mounted on portion 108. The first thickness can be lesser than the second thickness. The gap 109c facilitates the lateral movement of portion 108 to accommodate side components 126 and 126a with different thicknesses.

In some embodiments, a structural component 132, such as a retention bar 132 can be used to prevent excessive movement of flexible portion 108. In some embodiments, the retention bar 132 is mounted to at least one of the rigid substrates 112 and 114. In some embodiment, at least a portion of component 126a is mechanically attached to the structural component 132. In some embodiments, component 126a extends at least partially through housing 130. In some embodiments, at least a portion of component 126a is accessible from external through housing 130.

Figure 2:
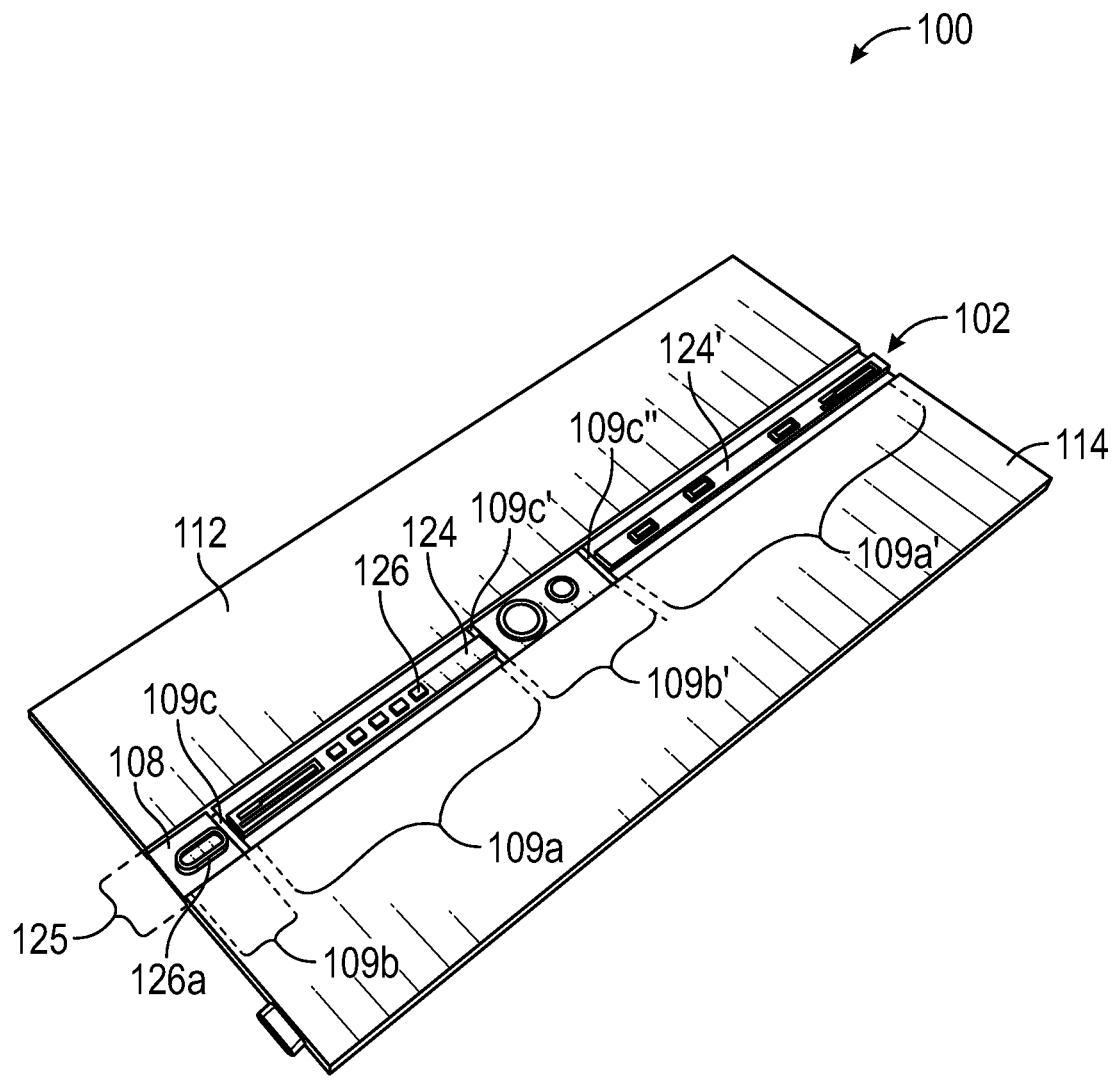
FIG. 2 shows a perspective view of the electronic assembly of FIGS. 1A-1B in a different configuration, in accordance with some example embodiments.

FIG. 2 shows a perspective view of the electronic assembly 100 (also shown in FIGS. 1A-1B) in an open configuration. Assembly 100 contains the same components as discussed with reference to FIGS. 1A-1C. However, FIG. 2 shows the assembly 100 prior to being bent. Visible are flexible substrate 102 with middle portion 108, the external sides of rigid substrates 112, 114, side panels 124, and side components 126.

In some embodiments, the middle portion 108 of flexible substrate 102 includes a plurality of side panels 124 and 124', and a plurality of gaps 109c, 109c' and 109c" separating a plurality of first segments 109a and 109a' from a plurality of second segments 109b and 109b'. In some embodiments, the plurality of side panels 124 and 124' can include different thickness profiles, such as the side panel 124 having a thickness greater than the thickness of the side panel 124'. In some embodiments, a plurality of side components such as components 126a and 126b with different thickness profiles are mounted on the middle portion 108. For example, component 126a disposed on segment 109b of the middle portion 108 can have a thickness greater than the thickness of the component 126b disposed on segment 109b'. In some embodiments, the gaps 109c, 109c' and 109c" can have width and length profiles vary from one another according to the magnitude of lateral movement required by portion 108.

Assembly 100 allows for reduction of footprint of the system by repartition of electronic components using the vertical interface area 125. This allows for improved electrical performance due to shorter and more direct routing through traces and components located in the vertical interface area. Specifically, this can result in less insertion loss or crosstalk coupling throughout assembly 100. Additionally, the mounting of components in vertical side face area 125 allows for minimized channel impedance mismatches (or signal return loss) between various components. This avoids undesirable signal path transitions such as plated through holes, ball-grid arrays or internal cable and connector assemblies.

Figure 3:
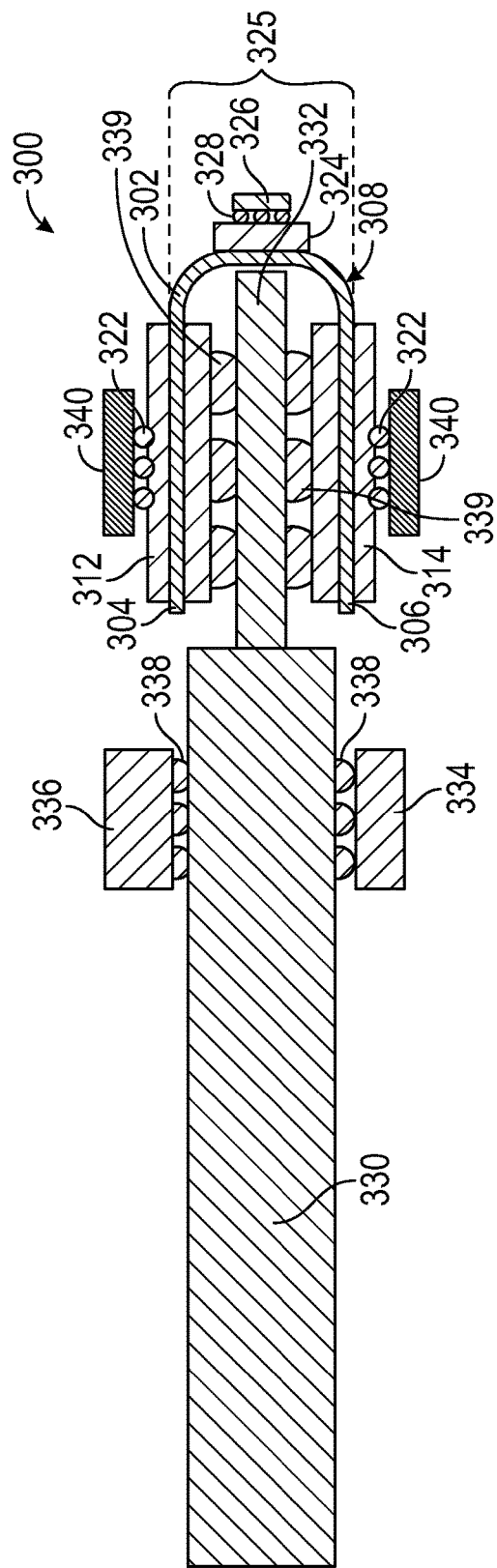
FIG. 3 shows a schematic cross-section view of an electronic assembly in accordance with some example embodiments.

FIG. 3 shows a schematic cross-section view of an electronic assembly 300 in accordance with some example embodiments. Assembly 200 is an example of a dual-sided PCB system with direct inter-package connections.

Assembly 300 can be, for example, a 3D foldable package device with a peripheral vertical interface for PCB form-factor miniaturization. Assembly 300 includes flexible substrate 302 with portions 304, 306, and 308, rigid substrates 312, and 314, with components 340 and interconnects 322, side panel 324, and side component 326 with interconnects 328. Assembly 300 additionally include printed circuit boards 330, 332 with components 334, 336, and interconnects 338.

Parts 302-328 are similar to their counterparts described with reference to FIGS. 1A-1C and 2 and are connected in a similar fashion. Here, printed circuit board (PCB) 330 hosts components 334, 336 interconnected to PCB 330 through interconnects 338. PCB 330 is directly connected to substrates 312, 314.

Printed circuit board 330 can be a standard PCB that mechanically and electrically connects components 334, 336, to the rest of assembly 300. PCB 330 can be, for example, an electrically nonconductive material, such as printed circuit board, organic packaging, silicon-based substrates, or interposers. Optionally, PCB can contain metallic traces or other interconnects. Components 334, 336 are connected to PCB 330 through interconnects 338, which can be, for example, a plurality of solder bumps or via.

PCB 332 resides internally to rigid substrates 312, 314, and can be directly interconnected with components and/or rigid substrates 312, 314. PCB 332 is electrically connected to PCB 330. In some embodiments, PCB 332 is a recessed part of PCB 330. For example, PCB 332 can have a thickness profile smaller than PCB 330. In some embodiments, PCB 332 can be formed with PCB 330. PCB 332 can be an electrically nonconductive material, such as printed circuit board, organic packaging, silicon-based substrates, or interposers.

Additionally, components 340 reside on and are interconnected to substrates 312, 314, and are electrically connected with traces (e.g., similar to traces 110 in FIG. 1A) and interconnects (e.g., similar to interconnects 121 in FIG. 1A). In some embodiments, the components 340 are electrically coupled to the side panel 324 and component 326 through flexible substrate 302. In some embodiments, the components 340 are electrically coupled to PCBs 330 and 332 through interconnects 339. Component 340 can be, for example, a CPU, a memory device, a graphic processor, a field programmable gate array (FPGA) or other processing component. Alternatively, component 340 can be, for example, a chipset or PCH.

In some embodiments, components 326, 334, 336, can include a plurality of antenna or radio frequency devices. This can allow for a wide coverage of angles for signal reception, increasing signal efficiency. In some embodiments, component 326 can extend at least partially through a housing (e.g., housing 130 depicted in FIG. 1D). In some embodiments, at least a portion of component 326 can be exposed through the housing.

In assembly 300, direct inter-packages connections surrounding the edges of PCBs and components allows better electrical performance. In some embodiment, this allows undesirable channel impedance discontinuities to be reduced (i.e., avoidance of package through hole structure, solder ball grid assemblies, or motherboard routing paths). In some embodiments, the assembly of direct inter-packages connections on the recessed PCB 332 can allow for overall system thickness reduction.

Figure 4A:
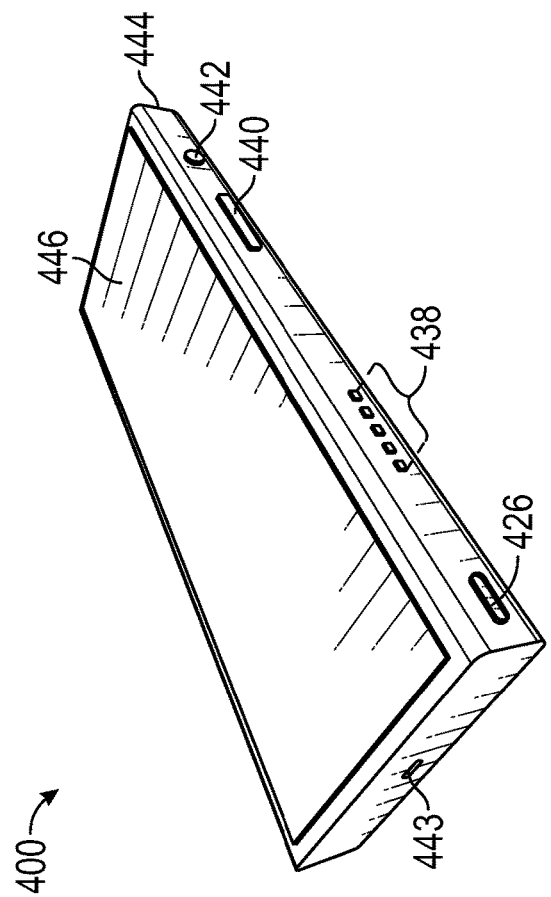
FIGS. 4A-4B show perspective views of an electronic device incorporating an electronic assembly in accordance with some example embodiment.
Figure 4B:
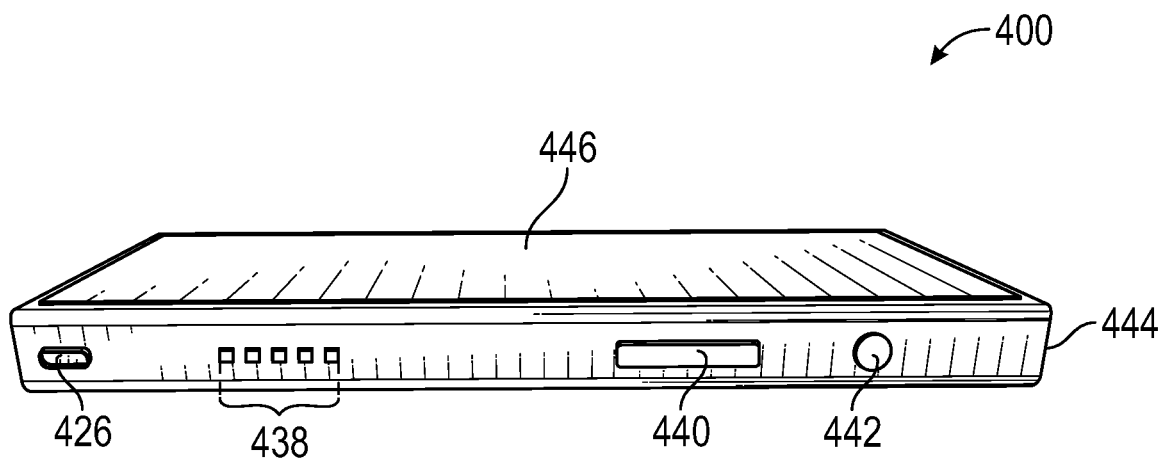

FIGS. 4A-4B show perspective views of an electronic device 400 incorporating an electronic assembly in accordance with some example embodiment. Device 400 includes components 426, 438, 440, 442, 443, casing 444, and screen 446.

In device 400, casing 444 and screen 446 enclose an assembly similar to assembly 100 or 300 described above. Components 426, 438, 440, 442 protrude outward of casing 444 for user interaction.

In some embodiment, component 426 is a speaker, directly interfaced to the flexible substrate described above. Components 438, 440, 442, are components mounted on a side panel, such as described above. Components 438, 440, 442, 443, can be, for example, an LED indicator, volume control, power switch, and USB-C port. All the components can be, for example, mounted in the vertical interface area.

Figure 5:
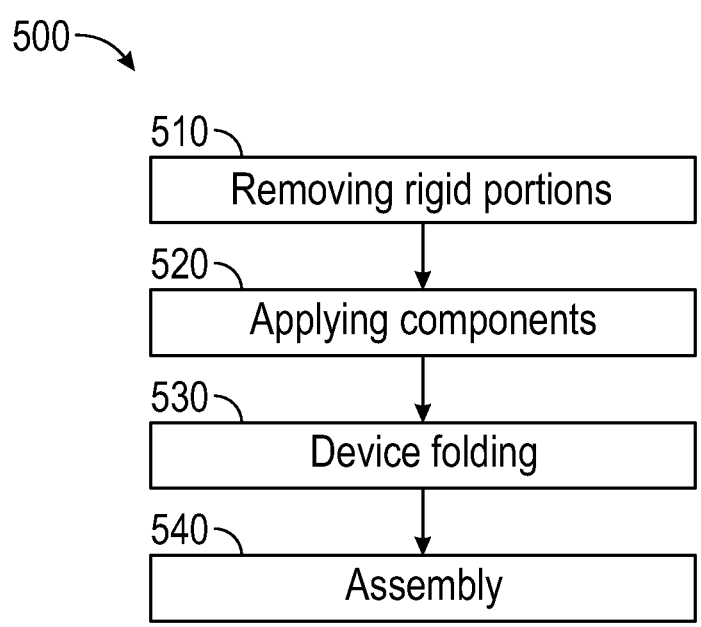
FIG. 5 shows a flow diagram of a method of manufacture of an electronic assembly in accordance with some example embodiments.

FIG. 5 shows a flow diagram of a method 500 of manufacture of an electronic assembly in accordance with some example embodiments. Method 500 includes steps 510 to 540, each a part of the manufacturing flow to assembly a 3D foldable substrate device with a peripheral vertical interface for improved electrical performance and form-factor miniaturization.

Step 510 includes removing PCB rigid portions with a flex process. Here, a standard, flat rigid-flex PCB is fabricated. The PCB contains an internal flexible portion sandwiched by two rigid portions. The internal flexible portion can be made, for example, of a polyimide based film or a liquid crystal polymer. The external rigid portions can be made, for example, of non-conductive materials such as printed circuit board, organic packaging, silicon-based substrates, or interposers.

In Step 510, part of the rigid portions are removed to expose select portions of the flexible portion beneath in a standard PCB process. This removal process can be done to remove rigid portions on both surfaces of the flat PCB. For example, a middle portion of the rigid substrate can be removed on a first side to create a joint where bending is desired. On the opposite side, the corresponding portion of rigid substrate can be removed to allow a flexible joint, such as the middle portion 108 of flexible substrate 102 in FIGS. 1A-1C and 2. Optionally, a portion of rigid substrate can be left on the middle portion to form a side panel, such as side panel 124 in FIGS. 1A-1C and 2.

Step 510 can include partial removal of the flexible portion through, for example, an etching or mechanical drilling process to form a plurality of segments along middle portion 108 (e.g., segments 109a and 109b in FIGS. 1A and 1B). The plurality of segments can be spaced apart by one or more gaps (e.g., gap 109c in FIGS. 1A and 1B).

Step 520 includes applying components to the PCB, the side panel, and the flexible portion through a standard surface mount technology (SMT) process. In an SMT process, individual components can be mounted or placed directly on the surface of the PCB, the side panel, and the flexible portion. Generally, the components can be attached to the PCB, the side panel, and the flexible portion through various interconnects, such as, for example, contact pad, metallic traces or via. In some cases, solder or other adhesive can be used to secure components. Components can be applied to the rigid portions of the PCB, the side panel, and the flexible portion on both sides as needed.

The components can include active or passive components, such as, for example, connectors, switches, displays, memory devices, processors, chipsets, transmitters or receivers. The components can be electrically coupled to each other as desired through interconnects, such as metallic traces laid into the PCB or the flexible substrate.

Step 530 includes device folding to form a 3D structure. Here, the middle portion of the flexible substrate is folded to create a joint, or a "vertical interface area" on which components can be mounted. The side of the assembly can be aligned so that they are parallel.

Step 540 including final system assembly and integration. Here, any outward casing or components can be added and electrically coupled to the assembly.

Figure 6:
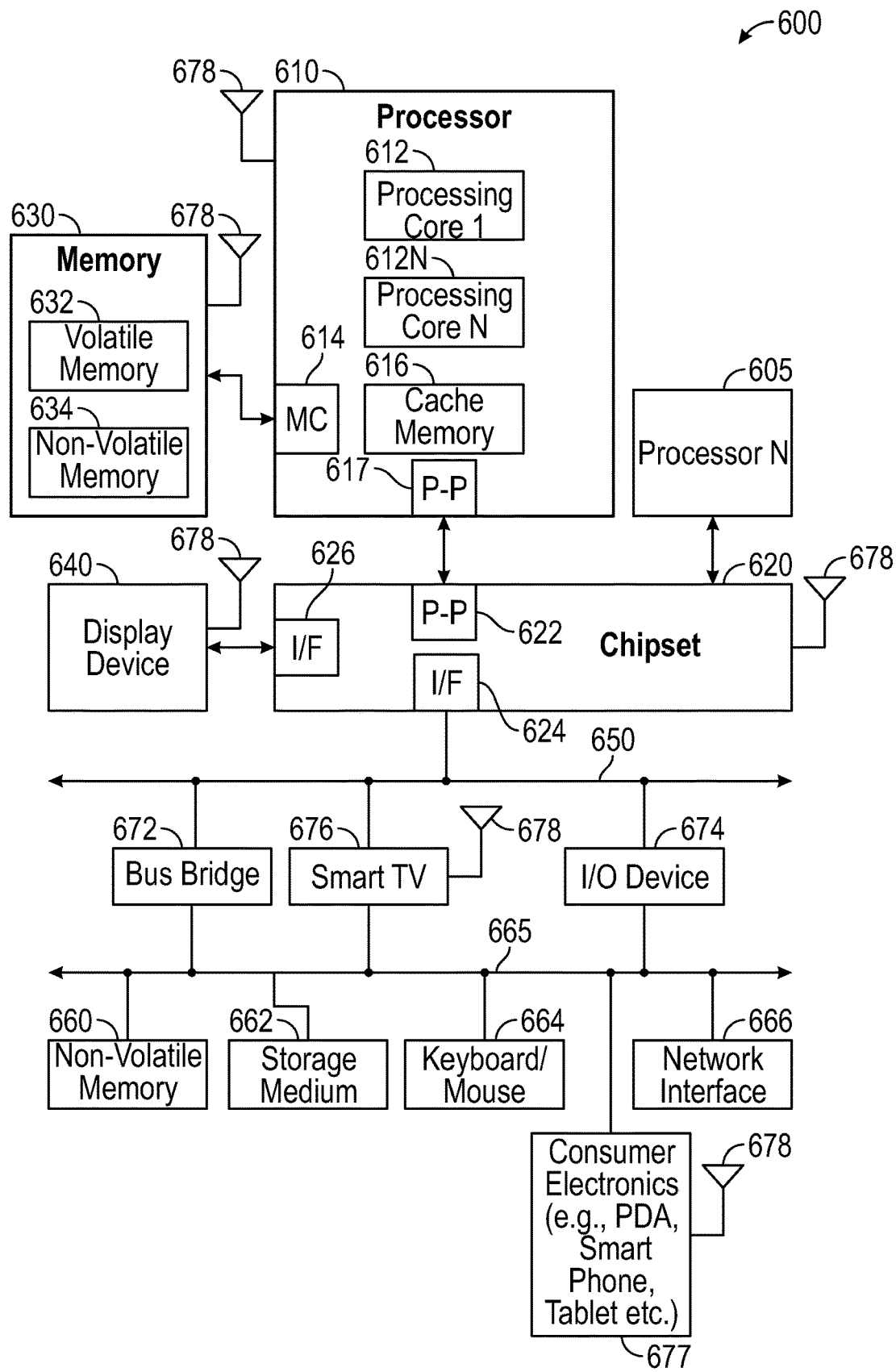
FIG. 6 shows a system that may incorporate an electronic assembly and methods, in accordance with some example embodiments.

FIG. 6 illustrates a system level diagram, depicting an example of an electronic device (e.g., system) that may include a 3D foldable substrate with vertical side interface and/or methods described above. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 includes a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family, Home Plug AV (HPAV), Ultra-Wide Band (UWB), Bluetooth, WiMAX, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals. In one example, any combination of components in a chipset may include a 3D foldable substrate with vertical side interface as described in the present disclosure.

Chipset 620 connects to display device 640 via interface 626. Display 640 may be, for example, a liquid crystal display (LCD), a light emitting diode (LED) array, an organic light emitting diode (OLED) array, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMAX, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

To better illustrate the method and apparatuses disclosed herein, a non-limiting list of embodiments is provided here:

Example 1 includes an electronic assembly comprising: a first rigid substrate; a second rigid substrate; a flexible substrate, and a component. The flexible substrate includes a first portion attached to the first rigid substrate; a second portion attached to the second rigid substrate; a middle portion connecting the first portion to the second portion, wherein the middle portion is bent; and conductive traces therethrough. The component forms a direct interface with the middle portion of the flexible substrate, the component electrically coupled to the conductive traces.

Example 2 includes Example 1, wherein the flexible substrate comprises a plurality of metallic layers alternating with a plurality of dielectric layers.

Example 3 includes any of Examples 1-2, wherein the component is a connector, a connector receptacle, an indicator, a switch, a display, a transmitter, or a receiver.

Example 4 includes any of Examples 1-3, wherein the middle portion of the flexible substrate comprises a first segment and a second segment separated by a gap.

Example 5 includes any of Examples 1-4, further comprising a third rigid substrate partially covering the first segment of the middle portion.

Example 6 includes any of Examples 1-5, wherein the component is disposed on the second segment of the middle portion, and wherein a second component is disposed on the third rigid substrate.

Example 7 includes any of Examples 1-6, wherein the second component disposed on the third rigid substrate has a first thickness, the component disposed on the second segment has a second thickness, and wherein the first thickness is less than the second thickness.

Example 8 includes any of Examples 1-7, wherein the component is directly connected to a portion of the flexible substrate not covered by the third rigid substrate.

Example 9 includes any of Examples 1-8, wherein the third rigid substrate comprises a printed circuit board, organic packaging, silicon-based substrates, or interposers.

Example 10 includes any of Examples 1-9, further comprising a retention bar mounted to the first or second rigid substrate, wherein the retention bar secures the component forming a direct interface on the middle portion of the flexible substrate.

Example 11 includes any of Examples 1-10, wherein the middle portion of the flexible substrate includes a portion that is orthogonal to the first and second portions of the flexible substrate.

Example 12 includes any of Examples 1-11, wherein the middle portion of the flexible substrate comprises a corner between the first rigid substrate and the second rigid substrate.

Example 13 includes any of Examples 1-12, wherein the first portion of the flexible substrate is sandwiched by two sub-components of the first rigid substrate, and the second portion of the flexible substrate is sandwiched by two sub-components of the second rigid substrate.

Example 14 includes any of Examples 1-13, further comprising an internal printed circuit board parallel to and adjacent to the first rigid substrate and the second rigid substrate.

Example 15 includes any of Examples 1-14, further comprising: an external printed circuit board forming a direct interface with the internal printed circuit board; and one or more components forming a direct interface with the external printed circuit board on an external surface of the external printed circuit board.

Example 16 includes a device including: an assembly, a casing surrounding the assembly, and a touch screen attached to the casing. The assembly includes a first rigid substrate, a second rigid substrate, a flexible substrate, and a component. The flexible substrate includes a first portion attached to the first rigid substrate; a second portion attached to the second rigid substrate; and a middle portion connecting the first portion to the second portion, wherein the middle portion is bent. The component forms a direct interface with the middle portion of the flexible substrate.

Example 17 includes Example 16, wherein the component extends at least partially through the casing.

Example 18 includes a method of making an assembly includes removing a portion of a printed circuit board to expose a central portion of flexible substrate; mounting one or more components on the printed circuit board and the central portion of the flexible substrate; and folding the printed circuit board along the central portion of the flexible substrate.

Example 19 includes Example 18, wherein folding comprises aligning first and second sides of the printed circuit board.

Example 20 includes any of Examples 18-19, further comprising enclosing the assembly in a housing, wherein the one or more components on the central portion of the flexible substrate extends at least partially through the housing.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. An electronic assembly comprising:
a first rigid substrate with a first component;
a second rigid substrate with a second component;
a side panel with a third component;
a flexible substrate having a first portion, a second portion, and a third portion between the first portion and the second portion, where, when the flexible substrate is in a bent configuration, the first portion and the second portion are opposite each other, and the third portion forms a bent portion of the flexible substrate,
wherein the first rigid substrate is attached to the first portion, the second rigid substrate is attached to the second portion, and the side panel is attached to the third portion;
a first printed circuit board situated between the first portion of the flexible substrate and the second portion of the flexible substrate, the first printed circuit board attached to the first portion on a first side, and the first printed circuit board attached to the second portion on a second side opposite the first side,
wherein the first printed circuit board is not attached to the third portion of the flexible substrate; and
a second printed circuit board attached to and extending from the first printed circuit board in a direction opposite the side panel, the second printed circuit board not attached to the flexible substrate.

2. The electronic assembly of claim 1, wherein the first rigid substrate comprises a first side attached to the first component and a second side attached to the first printed circuit board.

3. The electronic assembly of claim 2, wherein the first side of the first rigid substrate is on a first side of the flexible substrate, and the second side of the first rigid substrate is on a second side of the flexible substrate opposite the first side of the flexible substrate.

4. The electronic assembly of claim 1, wherein the second rigid substrate comprises a first side attached to the second component and a second side attached to the first printed circuit board.

5. The electronic assembly of claim 4, wherein the first side of the second rigid substrate is on a first side of the flexible substrate, and the second side of the second rigid substrate is on a second side of the flexible substrate opposite the first side of the flexible substrate.

6. The electronic assembly of claim 1, wherein the first printed circuit board is not attached to the side panel or the third component.

7. The electronic assembly of claim 1, further comprising interconnects between the first printed circuit board and the first component, and interconnects between the first printed circuit board and the second component.

8. The electronic assembly of claim 1, wherein the first printed circuit board mechanically and electrically connects the first component and the second component to the assembly.

9. The electronic assembly of claim 1, wherein the first printed circuit board is an electrically non-conductive material.

10. The electronic assembly of claim 1, wherein the first printed circuit board comprises organic packaging, silicon-based substrates, interposers, or combinations thereof.

11. The electronic assembly of claim 1, wherein the first printed circuit board further comprises one or more metallic traces.

12. The electronic assembly of claim 1, wherein the first printed circuit board is located internally from the first component and the second component within the assembly.

13. An electronic assembly comprising:
a first rigid substrate;
a second rigid substrate;
a flexible substrate comprising:
a first portion attached to the first rigid substrate;
a second portion attached to the second rigid substrate;
a middle portion connecting the first portion to the second portion, wherein the middle portion is bendable;
conductive traces therethrough; and
a component forming a direct interface with the middle portion of the flexible substrate on an external surface of the middle portion, the component electrically coupled to the conductive traces.

14. The assembly of claim 13, wherein the middle portion of the flexible substrate is bendable such that the flexible substrate can be formed into a bended form, wherein the first rigid substrate and the second rigid substrate are opposite each other in the bended form.

15. The assembly of claim 14, wherein the middle portion of the flexible substrate is malleable within the bended form.

16. The assembly of claim 14, wherein the first and section portions of the flexible substrate are not malleable within the bended form.

17. A flexible electronic substrate comprising:
a first portion, with a first rigid substrate thereon;
a second portion, with a second rigid substrate thereon;
a middle portion with a plurality of side panels thereon, each of the plurality of side panels having a thickness profile, wherein at least one of the plurality of side panels has a thickness profile different than one of the other side panels in the plurality,
wherein, in a bended form of the flexible substrate, the first portion and the second portion oppose each other, and are connected to each other through the middle portion; and
a component mounted at least partially on an external surface of the middle portion of the flexible substrate, the component electrically coupled to one or more other components on the first rigid substrate, the second rigid substrate, or both.

* * * * *